(12) United States Patent
Gulvin et al.

(10) Patent No.: US 7,274,842 B2
(45) Date of Patent: Sep. 25, 2007

(54) ACTUATOR AND SYSTEMS AND METHODS

(75) Inventors: Peter M Gulvin, Webster, NY (US); Jun Ma, Penfield, NY (US); Pinyen Lin, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 310 days.

(21) Appl. No.: 11/094,411

(22) Filed: Mar. 31, 2005

(65) Prior Publication Data

US 2006/0228069 A1    Oct. 12, 2006

(51) Int. Cl.
*G02B 6/26* (2006.01)

(52) U.S. Cl. .............................. 385/25; 385/15; 385/24

(58) Field of Classification Search ................... 385/15, 385/24, 25
See application file for complete search history.

(56) References Cited

U.S. PATENT DOCUMENTS 6,804,036 B1 * 10/2004 Chen et al. ................. 359/237

\* cited by examiner

*Primary Examiner*—Jennifer Doan
(74) *Attorney, Agent, or Firm*—Oliff & Berridge, PLC

(57) ABSTRACT

An actuator system that includes two beams that are formed into a diamond pattern. A crossbar is positioned at a mid-section to connect the two beams. When power is applied to the two beams, the diamond pattern is driven vertically. An actuator system may also include a substrate and a first layer above a second layer on the substrate. The first and second layers include upper and lower beams joined together at one end of the layers. A method of forming an actuator system includes forming a first layer above a second layer on a substrate, joining the first and second layers together at one end of the layers, and forming upper and lower beams. The upper and lower beams may be different in width, length and thickness to control a vertical movement of the actuator system.

19 Claims, 9 Drawing Sheets

# ACTUATOR AND SYSTEMS AND METHODS

BACKGROUND

1. Field of Invention

This invention relates to switches. More specifically, the systems and methods of the invention relate to actuator systems and methods that may be used in a switch.

2. Description of Related Art

Micro-electromechanical (MEMS) technology switches are used in many applications. For example, a MEMS switch may be used in microfluidics to open and close a valve, or to direct a flow of fluid through a pipe. Optical communications systems may utilize large amounts of bandwidth. In order to improve efficiency, many optical communications systems utilize MEMS optical switches. The switches may be used in optical communications systems to control a lightwave through a waveguide or to add/drop channels in a multiplexer. For example, the optical switches may add or drop input signals from a fiber optic source to a different fiber optic output port sometimes using optical multiplexers. The optical switches may also include both a shuttle mechanism that holds a routing waveguide structure, and actuators that physically move the shuttle mechanism and a latching system.

Conventional optical switches typically use separate components for the optical switch and the optical switch actuator. The conventional shuttle mechanisms use thermally operated actuators, which operate in a two-dimension (2D) in-plane actuation motion to control the switching function within the optical communications systems. For example, when the shuttle mechanism forms the switching element, the thermal actuators are thermally driven to cause the shuttle mechanism to move between switching positions. However, this configuration requires that the thermal actuators overcome both a restoring force of the suspension arms of the shuttle mechanism, and the thermal actuator itself. Thus, high actuation forces and long displacement distances are required in order to adequately drive the shuttle mechanism. As a result, the long displacement distances require that long thermal actuators be used with optical switch. Accordingly, increased space within the switching system is required which can subsequently cause an increased tendency toward out of plane deformation within the optical switch.

Conventional out-of-plane magnetic and electrostatic actuators are used with MEM technology today. However, magnetic drives require using high-powered magnets in close proximity to the chip. This complex arrangement causes problems when packaging the chips because some components may need to be protected from the magnet. With lower strength magnets, very large currents are required to drive the actuators. Electrostatic actuators require large amounts of area on a chip, which increases the manufacturing costs. The electrostatic actuators are generally driven by high voltages, which preclude using them in application where high voltages are not available. Moreover, a "pull-in" instability existing in voltage-driven electrostatic actuators limits the controllable range of motion unless a complex drive circuitry is used, e.g., a switched capacitor charge drive circuitry.

Standard thermal bimorphs can create an out-of-plane motion for use in a switch. However, the bimorphs must be composed of two different materials, which result in different coefficients of thermal expansion for each material. Because MEMS processing involves various high-temperature steps, most bimorphs are formed with defects. The conventional systems discussed above may significantly increase the size of the overall chip, and increase manufacturing and packaging costs.

SUMMARY

Based on the problems discussed above, there is a need for improved actuator systems and methods that may be used in a switch and may reduce the amount of space used in the chip.

Actuators with out-of-plane motion may significantly reduce the size of a MEMS switch that use in-plane-motion thereby reducing packing density and reducing overall costs. The out-of-plane motion may operate by geometrically constraining heated beams so that they can only move out-of-plane. Symmetrical beams that move within the same plane (versus out-of-plane) and that are composed of the same material are altered by changing the vertical symmetry of the beams, e.g. forming beams of the actuator system with different widths, heights and/or lengths. The beams (as actuators) may be further modified to support out-of-plane rotation, for example, by using different doping levels, different magnitudes of heating current or different beam geometrical dimensions for each beam. These actuators may provide improved benefits over two-dimension (2D) in-plane actuation because the actuators move three-dimensionally (3D) out-of-plane. Moreover, the actuators may eliminate the defects in bimorphs because the same material may be used for both beams.

In various exemplary embodiments, an actuator system may include two beams that are connected at end sections and formed into a diamond pattern. A crossbar may be positioned at a midsection of the two beams to connect the two beams. When power is applied to the two beams, the diamond pattern is thermally driven vertically.

An actuator system may include a substrate, a first layer positioned above a second layer on the substrate, the first layer formed longer than the second layer. The first and second layers may include upper and lower beams that are joined together at one end. The first and second layers may be separately connected to the substrate at an opposite end to form an air gap. The upper and lower beams may be formed to be different in width, length and/or thickness. When power is applied to the first and second layers, the one end of the upper and lower beams is driven vertically.

A method of forming an actuator system includes forming a first layer above a second layer on a substrate, the first layer is formed longer than the second layer. The first and second layers may be formed to include upper and lower beams, which are joined together at one end. The first and second layers may be connected separately to the substrate at an opposite end. The upper and lower beams may be formed to be different in width, length and/or thickness. When power is applied to the first and second layers, the one end of the upper and lower beams is driven vertically.

The first and second layers may include upper and lower beams that drive an optical waveguide when power is applied to the first and second layers to route communications signals.

In accordance with various exemplary embodiments, the actuator systems may be formed using MEMS microfabrication techniques such as surface micromachining or bulk micromachining.

For reasons of convenience, the embodiments of the disclosure will be discussed using an optical switch in conjunction with an optical add/drop multiplexer within an optical communications system. However, it should be appreciated by one skilled in the art that the actuator systems and methods may be used with any switching system without departing from the sprit and scope of the disclosure.

BRIEF DESCRIPTION OF THE DRAWINGS

Various exemplary embodiments of the systems and methods according to the invention will be described in detail, with reference to the following figures, wherein.

DETAILED DESCRIPTION OF EMBODIMENTS

Figure 1:
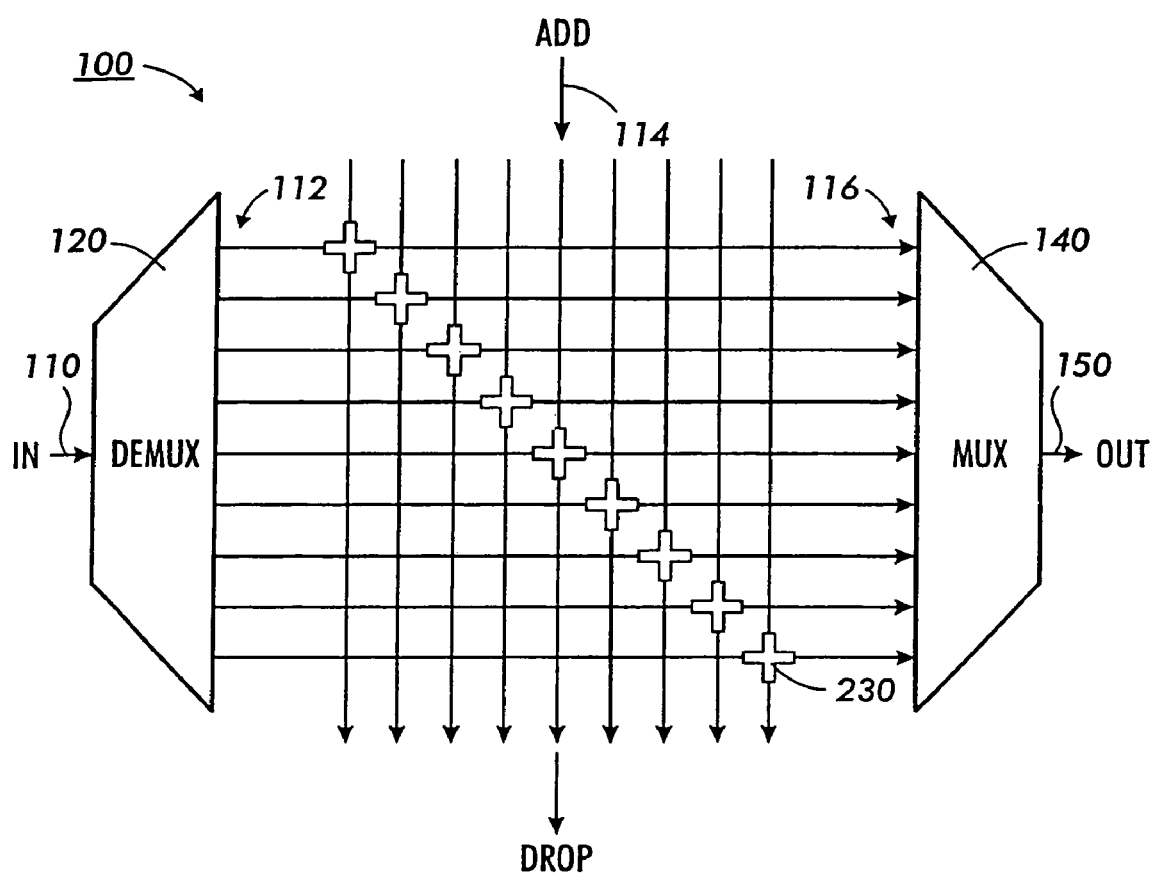
FIG. 1 is an exemplary diagram of an optical communications system.

FIG. 1 is an exemplary diagram of an optical communications system. In various exemplary embodiments, the optical communication system may be an optical add/drop multiplexer 100. The optical communication system in FIG. 1 is shown for exemplary purposes only and may include, for example, 8, 16, 32 or 64 channels. As shown in FIG. 1, the optical add/drop multiplexer 100 may receive an input optical signal 110 with many optical channels at different wavelengths from a single optical fiber. The input optical signal 110 is demultiplexed by demultiplexer 120 into separate optical channels 112 based on the wavelengths of the optical channels 112. Once the input optical signal 110 is demultiplexed, each of the separate optical channels 112 encounters one of a plurality of optical switches 230. The optical switches 230 may either pass or drop out the respective one of the optical channels 112. For any of the optical channels 112 that are dropped, a new signal 114 may be added by the optical switches 230 to further utilize that channel. Channels 116 that are passed or added by the optical switches 230 are remultiplexed by a multiplexer 140 into an output optical signal 150 and output to another single optical fiber. Because the channels may be dropped and added by the optical add/drop multiplexer 100, the output optical signal 150 may include a modified data stream as compared to the input optical signal 110.

Figure 2:
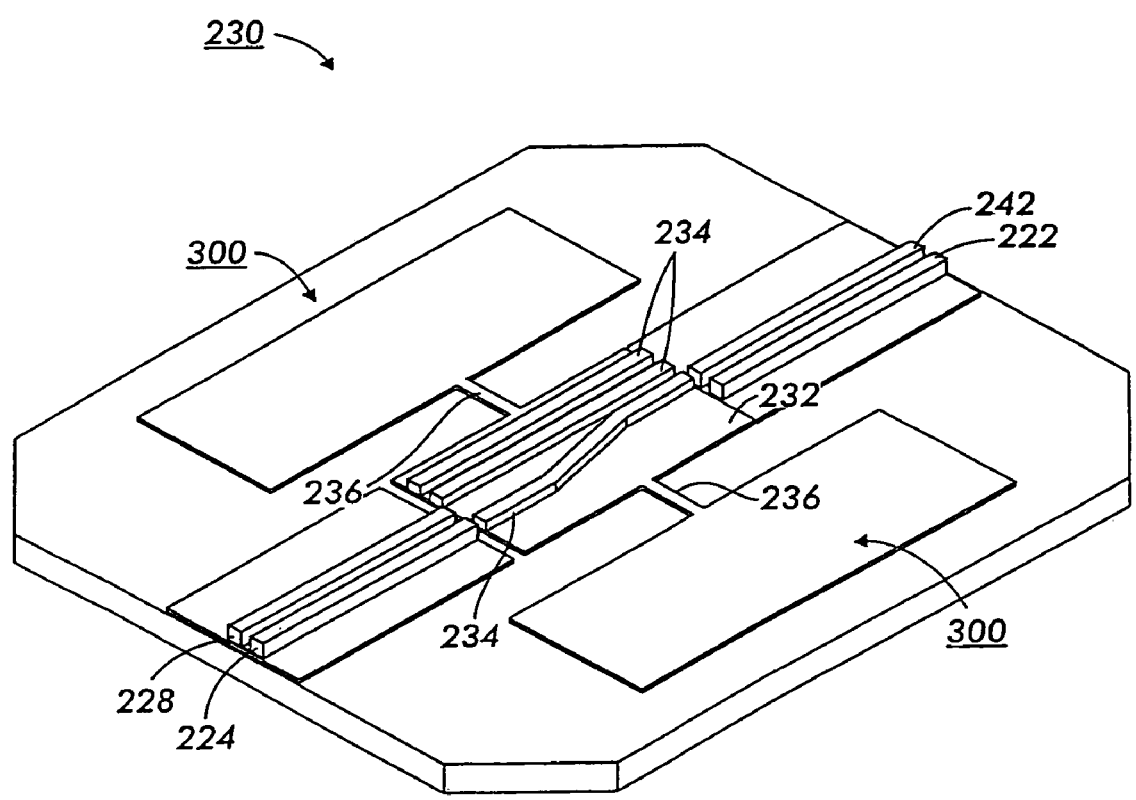
FIG. 2 is an exemplary diagram of an optical switch that may be used within the optical communications system of FIG. 1.

FIG. 2 is an exemplary diagram of an optical switch 230 that may be used within the optical communications system shown in FIG. 1. As shown in FIG. 2, the optical switch 230 may be used as a waveguide switch or optical changeover switch. The optical switch 230 includes a shuttle 232 with a plurality of waveguides 234. An input waveguide 222 corresponding to one of the channels 112 from the optical add/drop multiplexer 100 and a waveguide 242 for carrying the new signal 114 to be added are disposed on one of the waveguides 234. Similarly, an output waveguide 224 corresponding to one of the channels 116 of the optical add/drop multiplexer 100 and a waveguide 228 for dropping a signal are situated at the other end of the waveguides 234.

As indicated by the arrows in FIG. 2, the shuttle 232 may be driven or moved transversely by a pair of actuators 236. The actuators 236 may be of any suitable type, such as, for example, a thermal actuator, electrostatic actuator, magnetic actuator or piezoelectric actuator. The waveguides 234 are configured so that the transverse movement of the shuttle 232 will switch between one of the waveguides 234 connecting the input waveguide 222 to the output waveguide 224 and one of the waveguides 234 connecting the waveguide 242 carrying the new signal 114 to the output waveguide 224. To drop the signal of the input waveguide 222, one of the waveguides 234 can connect to the input waveguide 222 to the waveguide 228.

Figure 3:
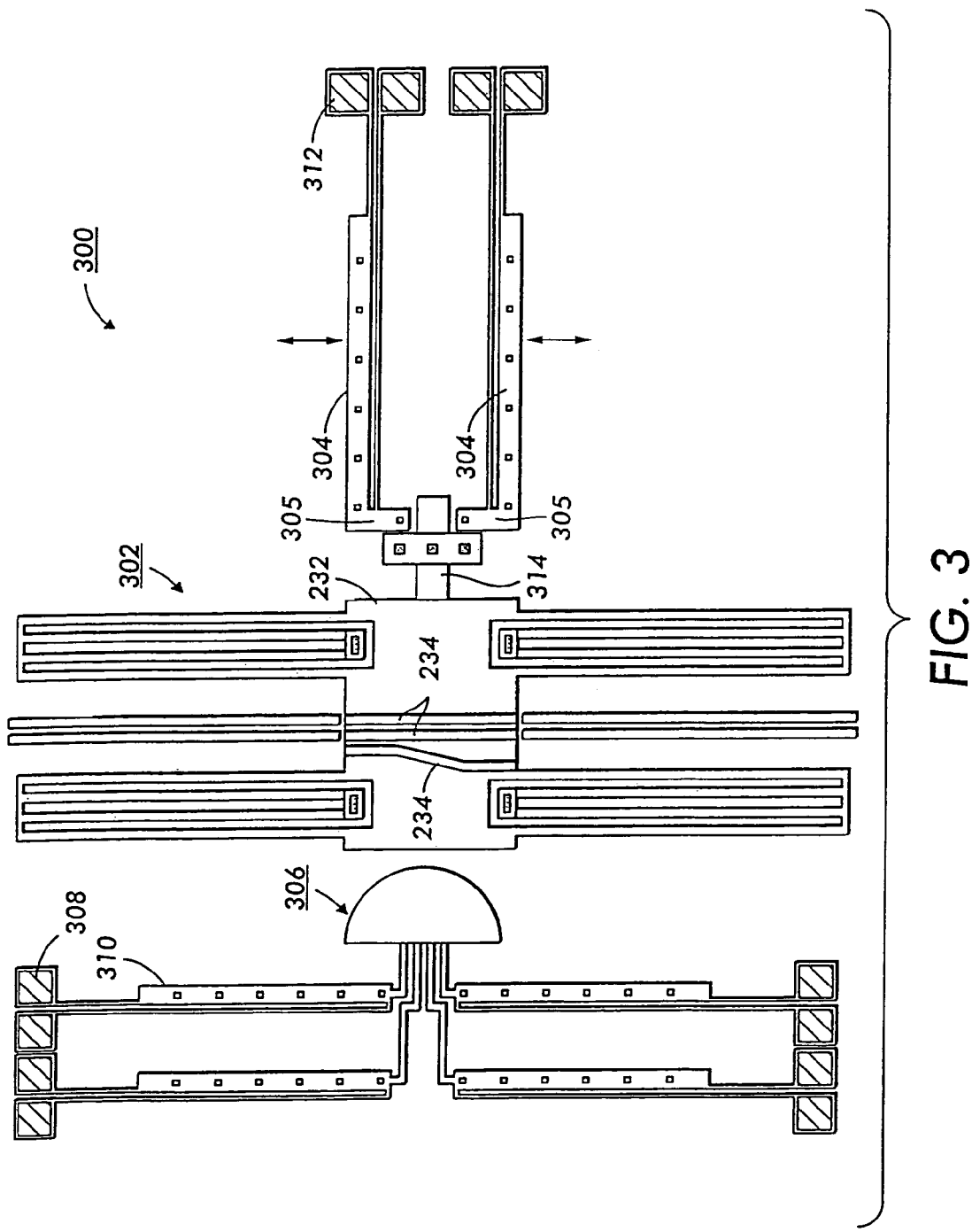
FIG. 3 is an exemplary diagram of an optical switch with conventional actuators.

FIG. 3 is an exemplary diagram of an optical switch with conventional latch and actuators that operate with 2D in-plane motion. As shown in FIG. 3, the optical shuttle device 300 includes thermal actuators 310 that have a stiffness, an actuator head 306 and springs 302. The actuator head 306 is connected to the thermal actuators 310. The springs 302 are connected to the shuttle 232 and are also fastened to the optical switch 230 (shown in FIG. 2). The springs 302 have a resistance or stiffness, and thus suspend the shuttle 232 so that it can be properly guided when driven. The optical shuttle device 300 also includes electric terminals 308 that are connected to the thermal actuators 310. The optical shuttle device 300 also includes latch thermal actuators 304 that are connected to electric terminals 312.

The optical shuttle device 300 in FIG. 3 is in a non-latched position whereby no power has been applied to the electric terminals 308 and the thermal actuators 310 are not displaced from a retracted position or an equilibrium position. Because the actuator head 306 does not contact the shuttle 232, the optical shuttle 232 is in a first location. However, when power is applied to the electric terminals 308, thermal expansion occurs in the thermal actuators 310 causing the thermal actuators 310 to be displaced from their retracted position. When the thermal actuators 310 are displaced, the actuator head 306 contacts the shuttle 232 and drives the shuttle 232 from an unlatched position (shown in FIG. 3) to a latched position (shown in FIG. 4). Because the shuttle 232 includes the optical component with the waveguides 234, the optical shuttle device 300 functions as a switch when it is driven by the actuator head 306 by controlling the waveguides 234 on the shuttle 232 to align with the various waveguides within the optical add/drop multiplexer 100. This function controls the direction of optical signals within the optical communications system.

Figure 4:
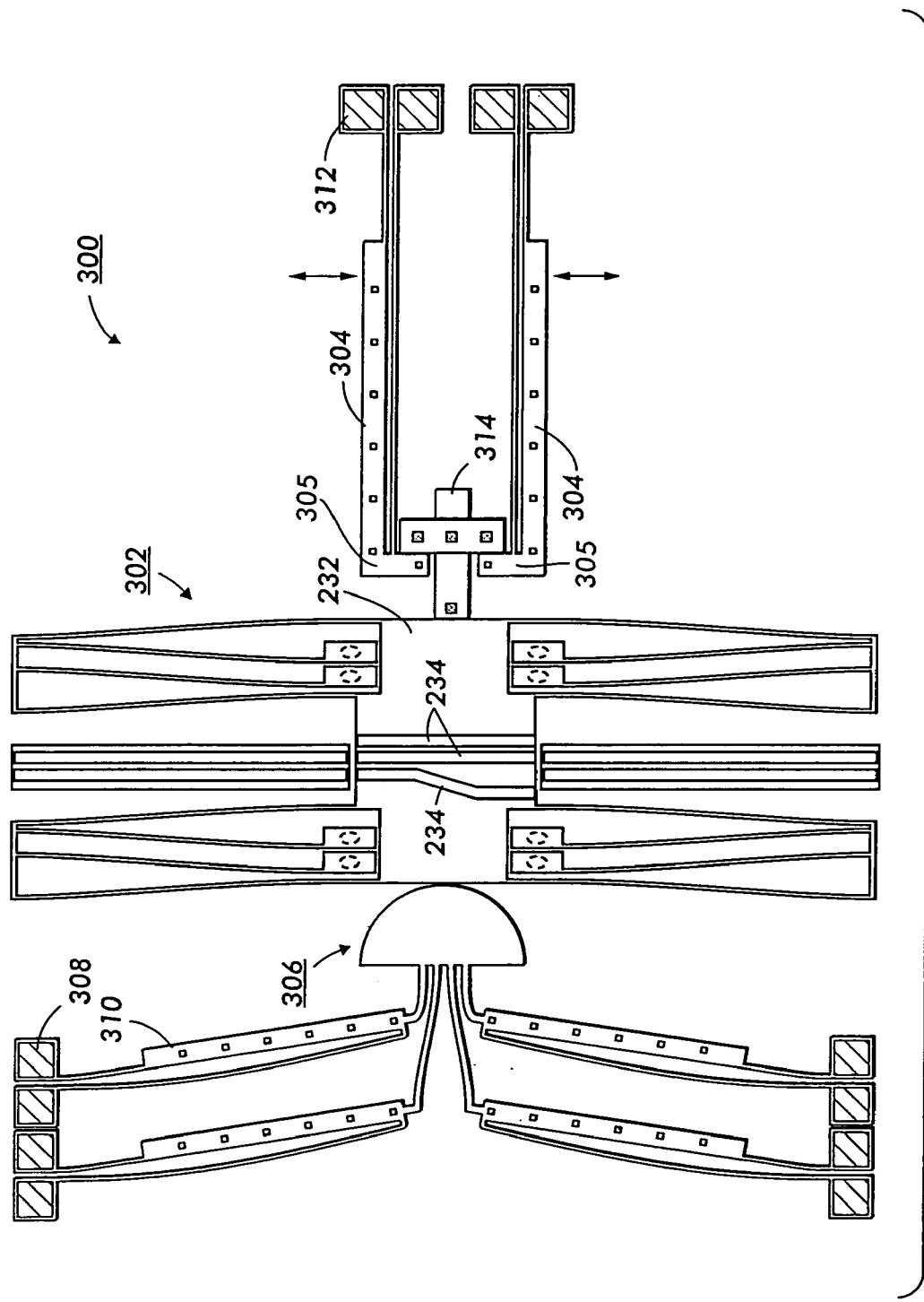
FIG. 4 is an exemplary diagram of the optical switch in a locking position.

FIG. 4 is an exemplary diagram of an optical switch in a locked position. As shown in FIG. 4, after power has been applied to the electric terminals 312, the latch thermal actuators 304 are driven to open up the latching teeth 305 during the switch and close the teeth 305 to lock the waveguide in the second location. The arrows show the direction of movement by the thermal actuators 304. When the thermal actuators 310 are displaced out of an equilibrium position, the stiffness (or resistance) that creates a restoring force in the thermal actuators 310 is overcome to displace the shuttle 232. Furthermore, the springs 302 are also folded and displaced as shown in FIG. 4 so that the movement of the shuttle 232 overcomes a restoring force in the springs 302. The folded springs 302 also supply a restoring force to return the shuttle 232 back to its equilibrium position. Once the shuttle 232 is driven to the predetermined position, the shuttle 232 is latched in place by applying power to the electric terminals 312, which causes the latch thermal actuators 304 with the teeth 305 to open up so that the latch 314 can be positioned inside of the teeth 305. The power is removed from the electric terminals 312 and the teeth 305 of the thermal actuators 304 close around the latch 314 and lock the shuttle 232 in place.

The conventional latch shown in FIGS. 3 and 4 shows an example of a latch arranged to include two sets of in-plane actuators with first actuators moving the shuttle to a desired position, and second actuators moving with respect to the shuttle to lock the shuttle position in place. As discussed above, the conventional arrangement of the thermal actuators consumes too much space and the required traveling distance and driving force of the latch thermal actuators 304 are too large. Thus, the switch arrangement increases the cost of the chips. Thus, the actuator systems discussed below may be used with an optical switch, e.g., to drive the waveguide, latch, latch receiver, etc., instead of the conventional actuators discussed above.

Figure 5A:
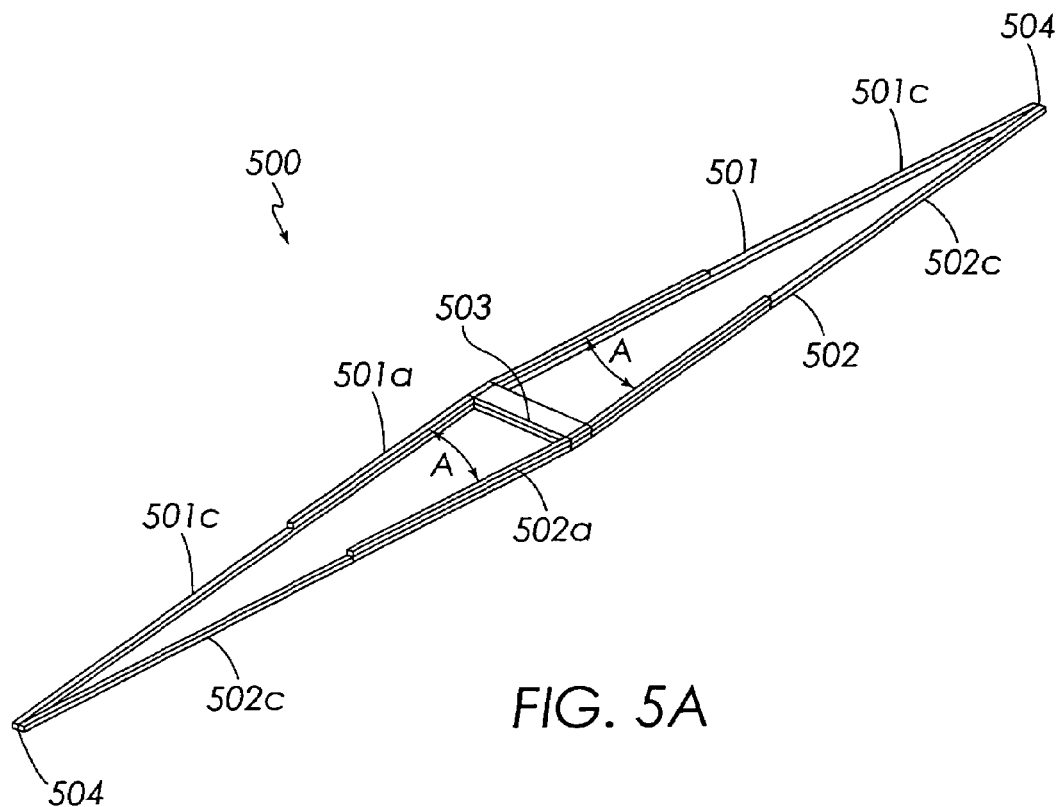
FIGS. 5A-B are exemplary diagrams of an embodiment of an actuator system.
Figure 5B:
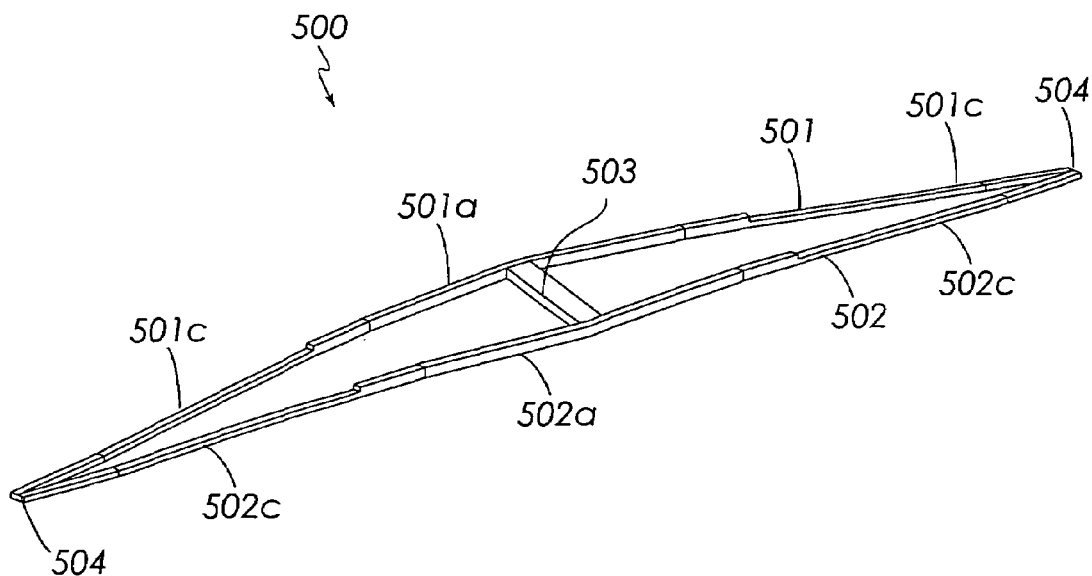

FIGS. 5A-B are exemplary diagrams of an embodiment of an actuator system. As shown in FIG. 5A, the actuator system 500 may include beams 501 and 502 that are formed into a diamond pattern. The actuator system 500 in FIG. 5A includes a crossbar 503 positioned between the beams 501 and 502 at a midsection. Although the actuator system 500 only includes one crossbar 503, it should be appreciated that any number of crossbars may be used without departing from the spirit and scope. The beams 501 and 502 may be composed of silicon so that the actuator system 500 is thermally driven. The ends 504 of the actuator system 500 may be connected to a power source so that power may be applied to thermally drive the actuator system 500. The actuator system may be formed structurally asymmetric so that the beams are predisposed to move in a specific direction. For example, each beam 501 and 502 may be formed thicker at the midsection 501a and 502a of the beams 501 and 502, and thinner towards end sections 501c and 502c of the beams 501 and 502. Once the power is applied to the asymmetric beams 501 and 502 shown in FIG. 5A, the beams 501 and 502 are driven such that the angle A in each half of the diamond shape attempts to increase in size. However, because the crossbar 503 prevents the angles A from increasing in size, the actuator system 500 is driven vertically as shown in FIG. 5B.

The actuator system 500 in FIGS. 5A-B may be formed to support out-of-plane rotation with the rotation axis being the longer diagonal of the elongated diamond. One of the two beams 501 and 502 may be formed with a larger thermal expansion than the other beam so that the one beam is predisposed to move in a different direction than the other beam. For example, the beams 501 and 502 may be doped at different doping levels, or current may be run through each beam 501 and 502 using different magnitudes. A plurality of beams may be ganged together to increase actuator strength. The out-of-plane up and down symmetry may also be altered by depositing metal on the beam surfaces or forming dimples on the beams.

Figure 6:
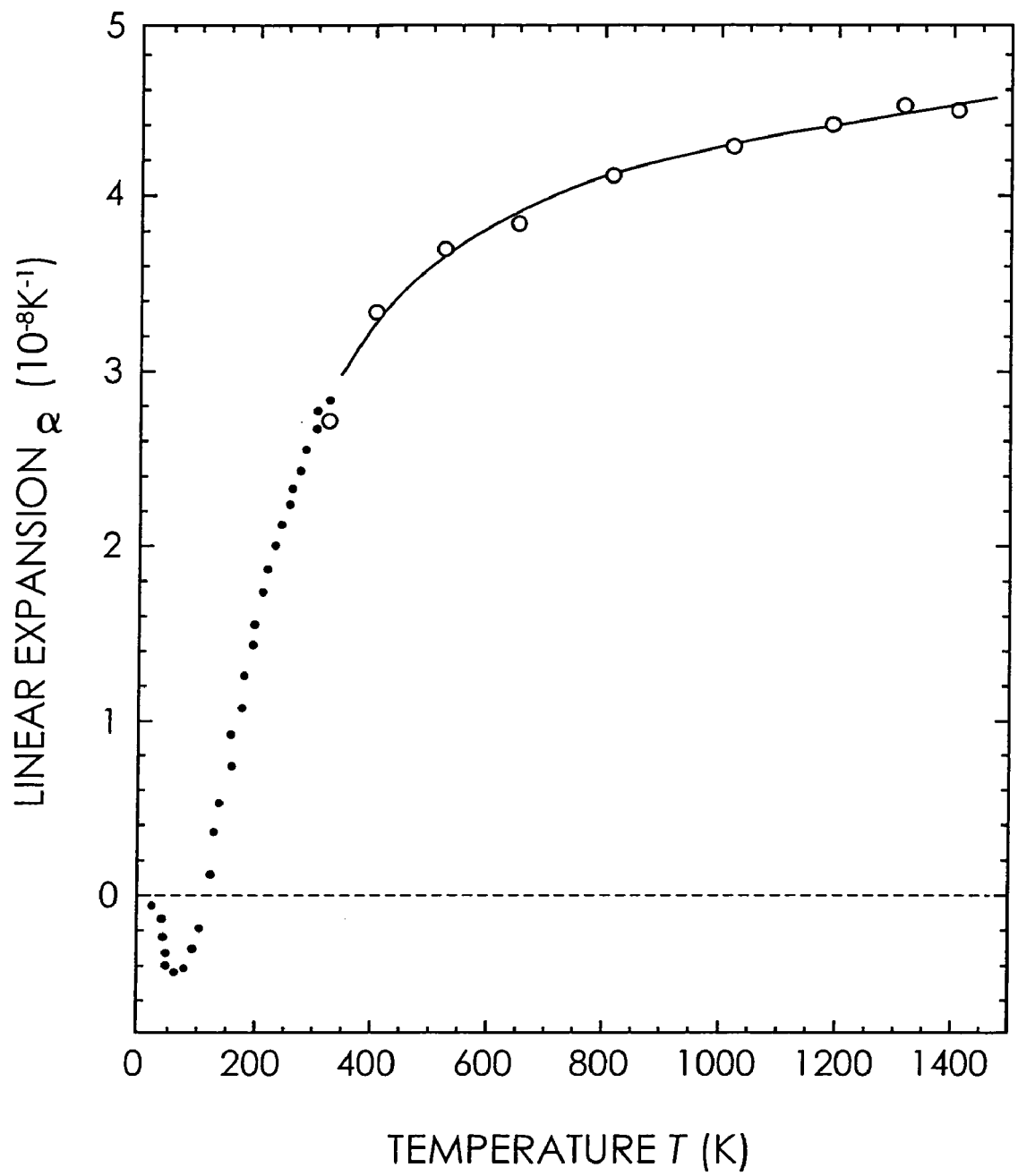
FIG. 6 is an exemplary diagram of thermal expansion coefficient of silicon.

FIG. 6 is an exemplary diagram of thermal expansion coefficient of silicon at various temperatures. Assuming for exemplary purposes that a first beam is at 600° C. while a second beam is at room temperature, the first beam will be 0.25% longer than the other beam when the power is applied. With a 1000 µm long beam and a 10 µm long crossbar, the out-of-plane rotation angle will be approximately 14 degrees, which is acceptable for MEMS switch applications.

When current (as the power) travels through a beam, the electrons collide with atoms within the beam and impart energy causing the atoms within the beam to vibrate. The vibration within the beam increases the average kinetic energy, e.g., temperature. The amount to energy imparted per unit time (power dissipated as heat) is shown in Eq. (1):

$$P = I^2 R \qquad \text{Eq. (1)}$$

The amount of heat energy imparted to the beam (Q) is thus the power (P) times the heating time (t) as shown in Eq. (2):

$$Q = P \times t \qquad \text{Eq. (2)}$$

The change in the temperature caused by the heat energy depends on the mass (m) of the material of the beam being heated and the heat capacity per unit mass (c) of the material as shown in Eq. (3):

$$\Delta T = Q/mc \qquad \text{Eq. (3)}$$

When the current begins flowing within the beam, the equations (1)-(3) determine how much the temperature in the beam will increase. The ultimate temperature that the beam will reach depends on the rate of heat loss from the beam. There is more heat loss from the beam when the temperature within the beam is increased. Thus, the temperature will continue to rise until the rate of the heat loss equals the rate of joule heating, or until the current is removed from the beam. Much of the heat loss occurs through the substrate and radiation.

If a bimorph includes a pair of layers with beams composed of different materials, each beam will expand at a different rate due to a difference in the thermal expansion coefficients of the materials. However, a differential expansion in the layers may still be accomplished to operate a switch by composing two beams of a bimorph of the same material if the two beams are formed into different geometric shapes. For example, the two layers may include beams that differ in height (e.g., thickness), width and/or length.

Figure 7:
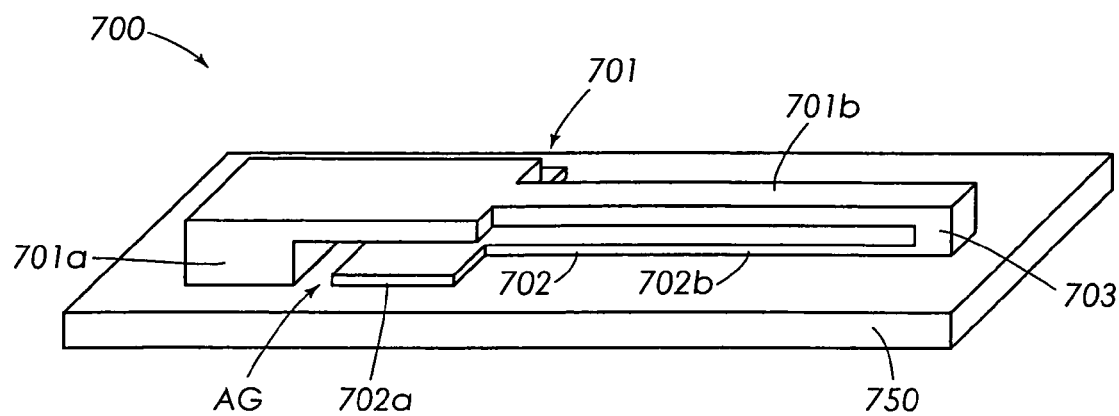
FIG. 7 is an exemplary diagram of another embodiment of an actuator system.

FIG. 7 is an exemplary diagram of another embodiment of an actuator system. As shown in FIG. 7, the actuator system 700 includes one beam that has an increases thickness compared to another beam. The actuator system 700 may include a first layer 701 positioned above a second layer 702 on a substrate 750. The layers 701-702 may be composed of silicon. An air gap AG may be formed when the first and second layers 701-702 are joined together at one end 703 and the opposite ends 701a and 702a are separately connected to the substrate 750. Although the embodiments are shown including the air gap AG between the layers, it should be appreciated that an insulator may be used instead of the air gap AG to separate the layers without departing from the spirit and scope. The first and second layers 701-702 may be formed so that upper and lower beams 701b and 702b are formed.

When current as the power is applied to the actuator system 700 shown in FIG. 7, the current will travel in a loop down one beam and back through the other beam. The direction of the current does not affect the motion of the actuator system 700. The amount of current traveling through any section of the first or second layer 701-702 is the same no matter which cross-section is sampled in view of Kirchoff's Second Law. If the cross-sectional area of the upper and lower beams 701b and 702b changes with length, the same amount of current will provide a different current density. The current density determines the amount of joule heating within the upper and lower beams 701b and 702b when applying the current to the beams. For example, if the lower beam 702b is half the thickness as the upper beam 701b, the lower beam 702b will have twice as much joule heating as the upper beam 701b because the power (P) dissipated is $P=I^2R$. Thus, the lower beam 702b has twice the resistance as the upper beam 701b so that the power dissipated is doubled.

The lower beam 702b may also be composed of half the quantity of material as the upper beam 701b. Thus, because there is half as much material to heat in the lower beam 702b as compared to the upper beam 701b, the induced temperature difference between the lower beam 702b and the upper beam 701b will be 4× the amount of the difference in material. If the lower beam 702b and the upper beam 701b are formed with a different thickness, the heating of the lower beam 702b and the upper beam 701b will be different when the current is applied to the actuator system. The lower beam 702b in FIG. 7 as the thinner layer will become hotter that the upper beam 701b as the thicker layer. Thus, the lower beam 702b will expand more than the upper beam 701b. As a result, when current is applied to the actuation system 700 in FIG. 7, the one end 703 and the upper and lower beams 701b and 702b are driven upward. The amount of distance that the one end 703 and the upper and lower beams 701b and 702b are driven upward depends on the amount of current applied to the actuation system 700, the relative thickness of the upper and lower beams 701b and 702b and how the thermal coefficient of expansion for the material of upper and lower beams 701b and 702b changes with temperature. When power is removed from the actuator system 700, the one end 703 and the upper and lower beams 701b and 702b are return to their equilibrium position.

Figure 8:
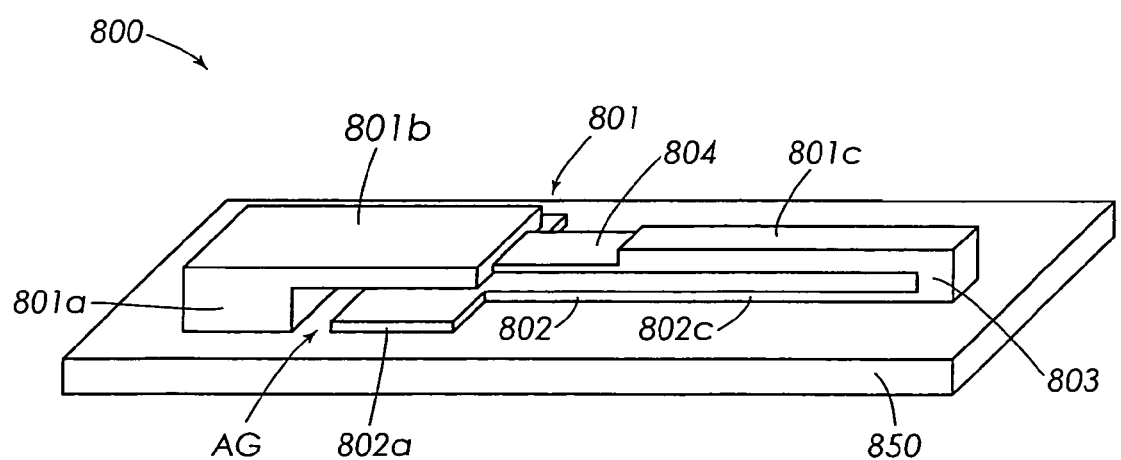
FIG. 8 is an exemplary diagram of another embodiment of an actuator system.

FIG. 8 is an exemplary diagram of another embodiment of an actuator system. As shown in FIG. 8, the actuator system 800 also varies the thickness of each beam. The actuator system 800 may include a first layer 801 positioned above a second layer 802 on a substrate 850. The layers 801-802 may be composed of silicon. An air gap AG may be formed when the first and second layers 801-802 are joined together at one end 803 and the opposite ends 801a and 802a are separately connected to the substrate 850. As discussed above, an insulator may be used instead of the air gap AG to separate the layers. The first and second layers 801-802 may be formed so that upper and lower beams 801c and 802c are formed. The actuator system 800 in FIG. 8 is structured so that the upper beam 801c is thicker than the lower beam 802c.

The upper beam 801c may be formed so that an inner section 804 of the upper beam 801c is thinner than an outer section of the upper beam 801c. The thinner inner section 804 increases the flexibility of the overall structure of the actuator system 800. Thus, as a result, when current is applied to the actuation system 800 in FIG. 8, the one end 803 and the upper and lower beams 801c-802c will be driven upward with increased deflection over the actuator system 700 shown in FIG. 7. The structure of the actuator system 800 decreases the difference in expansion between the upper and lower beams 801c-802c, but the net result is still a larger displacement than the actuator system 700 in FIG. 7. The upper layer 801 is also formed to include a wide section 801b of silicon that "reaches over" the top of the second layer 802 so that the effective lengths of the two beams are the same. Because the width of the wide section 801b of silicon is wider than the upper and lower beams 801c-802c, the heating and change in temperature are negligible. When power is removed from the actuator system 800, the one end 803 and the upper and lower beams 801c and 802c return to their equilibrium position.

Figure 9:
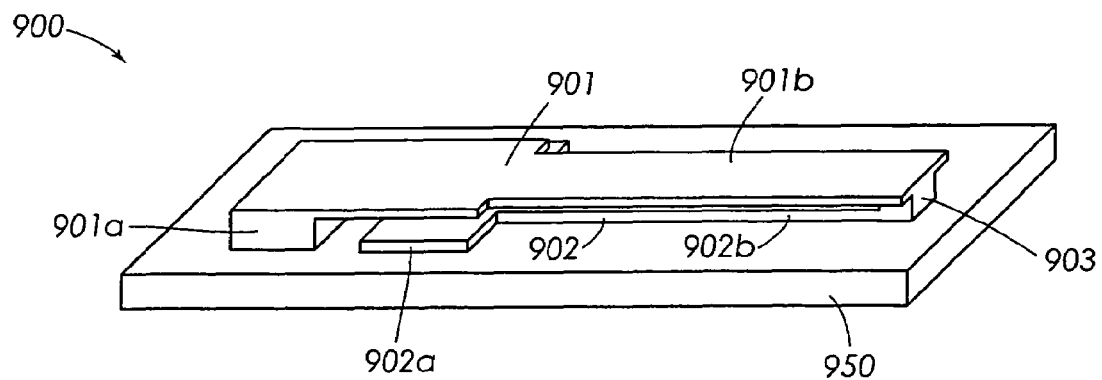
FIG. 9 is an exemplary diagram of another embodiment an actuator system.

FIG. 9 is an exemplary diagram of another embodiment an actuator system. As shown in FIG. 9, the actuator system 900 varies the widths of the beams. The actuator system 900 may include a first layer 901 positioned above a second layer 902 on a substrate 950. The layers 901-902 may be composed of silicon. An air gap AG may be formed when the first and second layers 901-902 are joined together at one end 903 and the opposite ends 901a and 902a are separately connected to the substrate 950. The first and second layers 901-902 may be formed with upper and lower beams 901b and 902b. As discussed above, an insulator may be used instead of the air gap AG to separate the layers.

The widths of the upper and lower beams 901b and 902b may be formed to be different, as shown in the actuator system 900 in FIG. 9. For example, the width of the upper beam 901b may be formed to be wider than the width of the lower beam 902b. The variation in widths may be used to counteract a force created by differences in thickness between the upper and lower beams 901b and 902b to prevent the beams 901b-902b from being driven in an undesirable direction. For example, if it is desirable to drive the upper and lower beams 901b-902b upward and out-of-plane, but the lower beam 902b is formed to be thicker than the upper beam 901b by a factor of two, the upper beam 901b could be formed to be 3-4 times wider than the lower beam 902b, thus giving the upper beam 901b a larger cross-section than the lower beam 902b. This structure will compensate for a driving force created by the different thickness of each beam when power is applied to the actuator system 900. When power is removed from the actuator system 900, the one end 903 and the upper and lower beams 901b and 902b return to their equilibrium position.

Figure 10:
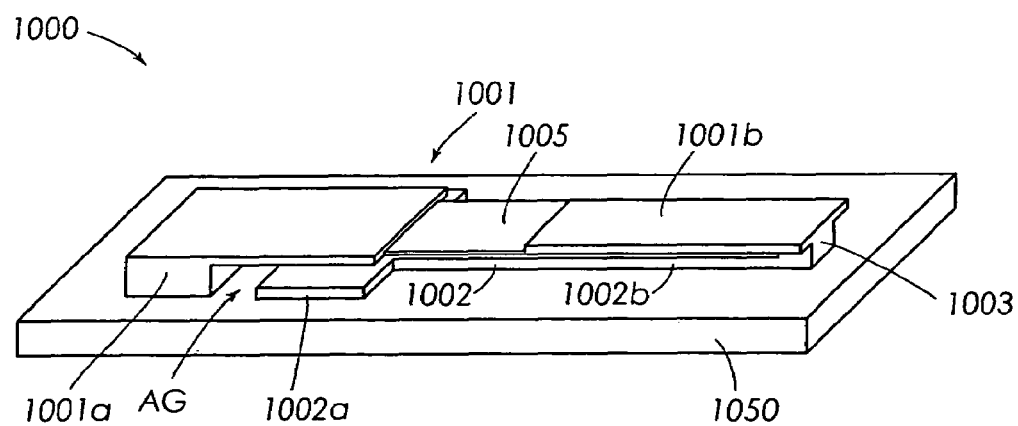
FIG. 10 is an exemplary diagram of another embodiment of an actuator system.

FIG. 10 is an exemplary diagram of another embodiment of an actuator system. As shown in FIG. 10, the actuator system 1000 varies the widths of the beams. The actuator system 1000 may include a first layer 1001 positioned above a second layer 1002 on a substrate 1050. The layers 1001-1002 may be composed of silicon. An air gap AG may be formed when the first and second layers 1001-1002 are joined together at one end 1003 and the opposite ends 1001a and 1002a are separately connected to the substrate 1050. The first and second layers 1001-1002 may be formed to include upper and lower beams 1001b and 1002b. As discussed above, an insulator may be used instead of the air gap AG to separate the layers.

The upper beam 1001b may be formed so that an inner section 1005 of the upper beam 1001b is thinner than an outer section of the upper beam 1001b. The thinner inner section 1005 increases the flexibility of the overall structure of the actuator system 800. In FIG. 10, the thinner inner section 1005 is thinner than the lower beam 1002b. Thus, the formation of the inner section 1005 decreases the difference in the expansion of the upper and lower beams 1001b-1002b. When current is applied to the actuation system 1000 in FIG. 10, the one end 1003 and the upper and lower beams 1001b-1002b are driven upward. The thinner inner section 1005 should be formed optimally so that it does not cause the upper beam 1001b to expand more that the lower beam 1002b and reverse an intended direction of motion of the upper and lower beams 1001b-1002b. When power is removed from the actuator system 1000, the one end 1003 and the upper and lower beams 1001b and 1002b return to their equilibrium position.

Figure 11:
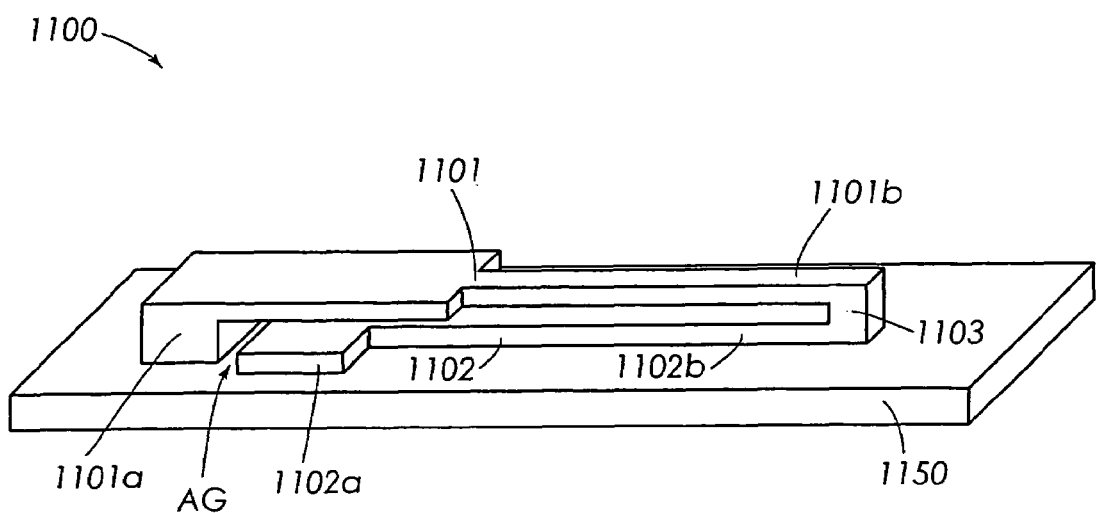
FIG. 11 is an exemplary diagram of another embodiment of an actuator system.

FIG. 11 is an exemplary diagram of another embodiment of an actuator system. As shown in FIG. 11, the actuator system 1100 varies the lengths of each beam. The actuator system 1100 may include a first layer 1101 positioned above a second layer 1102 on a substrate 1150. The layers 1101-1102 may be composed of silicon. An air gap AG may be formed when the first and second layers 1101-1102 are joined together at one end 1103 and the opposite ends 1101a and 1102a are separately connected to the substrate 1150. As discussed above, an insulator may be used instead of the air gap AG to separate the layers. The first and second layers 1101-1102 may be formed to include upper and lower beams 1101b and 1102b. A wide section 1104 may be formed connected to the upper beam 1101b.

The amount of length change ΔL created by a change in temperature ΔT for a material with a given coefficient of thermal expansion (CTE) is expressed as a percentage of its length, as shown in Eq. (4):

$$\Delta L/L = \Delta T \times CTE \qquad \text{Eq. (4)}$$

Thus, for a given change in temperature, longer beams elongate more than shorter beams. Based on this equation, the wide section 1104 in FIG. 11 will not significantly increase in temperature. Accordingly, the effective length of the upper beam 1011b is shorter than the effective length of the lower beam 1102b. Thus, for the same temperature, a differential length is achieved and the upper and lower beams 1101b-1102b are driven upward out-of-plane when power is applied to the actuator system 1100. When power is removed from the actuator system 1100, the one end 1103 and the upper and lower beams 1101b and 1102b return to their equilibrium position.

Figure 12:
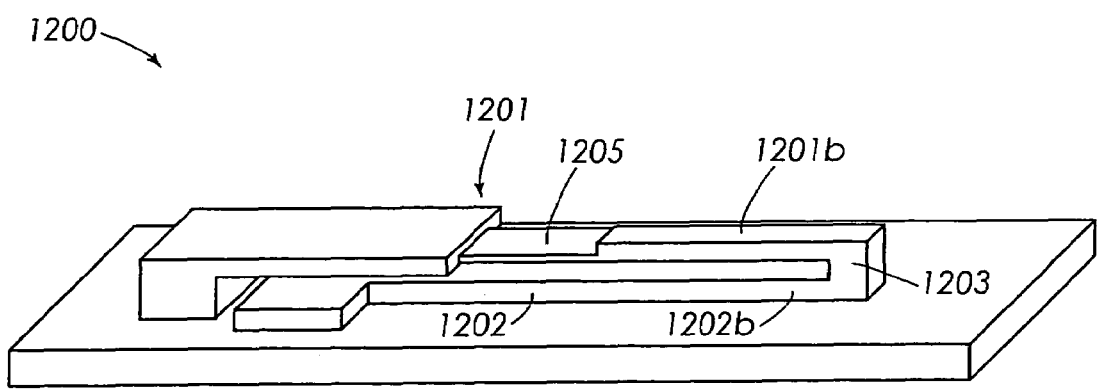
FIG. 12 is an exemplary diagram of another embodiment of an actuator system.

FIG. 12 is an exemplary diagram of another embodiment of an actuator system. The upper beam 1201b may be formed so that an inner section 1205 of the upper beam 1201b is thinner than an outer section of the upper beam 1201b. The thinner inner section 1205 increases the flexibility of the overall structure of the actuator system 1200. In FIG. 12, the thinner inner section 1205 is thinner than the lower beam 1202b. The formation of the inner section 1205 decreases the difference in the expansion of the upper and lower beams 1201b-1202b. When current is applied to the actuation system 1200 in FIG. 12, the one end 1203 and the upper and lower beams 1201b-1202b are driven upward. The inner section 1205 should be formed optimally so that it does not cause the upper beam 1201b to expand more that the lower beam 1202b and reverse an intended direction of motion of the upper and lower beams 1201b-1202b. When power is removed from the actuator system 1200, the one end 1203 and the upper and lower beams 1201b and 1202b return to their equilibrium position.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be emcompassed by the following claims.

What is claimed is:

1. An actuator system, comprising:
two beams that are connected at end sections and formed into a diamond pattern;
a crossbar positioned at a midsection of the two beams to connect the two beams,
when power is applied to the two beams, the diamond pattern is thermally driven vertically in plan view; and
a midsection of the two beams being formed thicker than the end sections of the two beams.

2. The actuator system of claim 1, comprising the two beams being composed of silicon.

3. The actuator system of claim 1, comprising one of the two beams being doped at a different doping level than the other beam.

4. The actuator system of claim 1, comprising one of the two beams receiving a different magnitude of power than the other beam.

5. The actuator system of claim 1, comprising the two beams driving an optical waveguide when power is applied to the two beams.

6. An actuator system, comprising:
a substrate; and
a first layer positioned above a second layer on the substrate, the first layer formed longer than the second layer,
the first and second layers joined together at one end of the layers and separately connected to the substrate at an opposite end of the layers to form an air gap; and
when power is applied to the first and second layers, the one end of the first and second layers is driven vertically.

7. The actuator system of claim 6, comprising the first and second layer being formed of silicon.

8. The actuator system of claim 6, comprising the first and second layers being formed to include upper and lower beams.

9. The actuator system of claim 8, comprising the upper beam being formed thicker than the lower beam.

10. The actuator system of claim 8, comprising the upper beam being formed wider than the lower beam.

11. The actuator system of claim 8, comprising the upper beam being formed shorter than the lower beam.

12. The actuator system of claim 6, comprising the upper and lower beams driving an optical waveguide when power is applied to the first and second layers.

13. The actuator system of claim 8, comprising an inner section of the upper beam being formed to be thinner than an outer section of the upper beam.

14. A method of forming an actuator system, comprising:
forming a first layer above a second layer on a substrate, the first layer formed longer than the second layer;
joining the first and second layers together at one end of the layers; and
connecting the first and second layers separately to the substrate at an opposite end of the layers to form an air gap.

15. The method of claim 14, comprising forming the first and second layers of silicon.

16. The method of claim 15, comprising forming the first and second layers to include an upper beam thicker than a lower beam.

17. The method of claim 15, comprising forming the first and second layers to include an upper beam wider than a lower beam.

18. The method of claim 15, comprising forming the first and second layers to include an upper beam longer than a lower beam.

19. A method of using the actuator system of claim 14, comprising:
using the actuator system in a switch and applying power to the first and second layers to position an optical waveguide by driving the one end of the first and second layers vertically.

* * * * *